United States Patent
Lai et al.

(10) Patent No.: US 6,526,429 B1
(45) Date of Patent: Feb. 25, 2003

(54) METHOD FOR DESIGNING ALL PASS DIGITAL FILTERS

(75) Inventors: Yhean-Sen Lai, Warren, NJ (US); Kannan Rajamani, Edison, NJ (US)

(73) Assignee: Agere Systems Inc., Allentown, PA (US)

(*) Notice: Subject to any disclaimer, the term of this patent is extended or adjusted under 35 U.S.C. 154(b) by 0 days.

(21) Appl. No.: 09/549,753

(22) Filed: Apr. 14, 2000

(51) Int. Cl.$^7$ ............................................... G06F 17/10
(52) U.S. Cl. ...................................... 708/300; 708/323
(58) Field of Search ................................. 708/300, 323

(56) References Cited

U.S. PATENT DOCUMENTS

| | | | | |
|---|---|---|---|---|
| 3,997,772 A | * | 12/1976 | Crochiere et al. | 708/313 |
| 5,144,569 A | * | 9/1992 | Kunold | 708/300 |
| 5,654,909 A | * | 8/1997 | Sun | 708/300 |
| 5,687,101 A | * | 11/1997 | Lee | 702/190 |

OTHER PUBLICATIONS

Reddy et al., "Digital All–Pass Filter Design Through Discrete Hilbert Transform," 1990 IEEE International Symposium on Circuits and Systems, vol. 1, pp. 646–649, May 1990.

Paul A. Bernhardt, "Simplified Design of High–Order Recursive Group–Delay Filters," IEEE Transactions on Acoustics, Speech, and Signal Processing, vol. ASSP–28, No. 5, pp. 498–503, Oct. 1980.

B. Yegnanarayana, "Design of Recursive Group–Delay Filters by Autoregressive Modeling," IEEE Transactions on Acoustics, Speech, and Signal Processing, vol. ASSP–30, No. 4, pp. 632–637, Aug. 1982.

* cited by examiner

Primary Examiner—David H. Malzahn

(57) ABSTRACT

A method for designing an all pass filter, in accordance with the present invention, includes providing a plurality of signals having a group delay, and normalizing the group delay to determine a normalized group delay function. Cepstral coefficients of the normalized group delay function are determined for to a denominator polynomial of a transfer function of the all pass filter wherein a magnitude function and the normalized group delay function of the denominator polynomial are related through the cepstral coefficients. The denominator polynomial coefficients are determined through a non-linear recursive difference equation by employing the cepstral coefficients.

20 Claims, 3 Drawing Sheets

DESIRED GROUP DELAY

GROUP DELAY OF THE DELAY REALIZED FILTER FOR N=10

ERROR IN GROUP DELAY FOR N=10

GROUP DELAY OF THE REALIZED FILTER FOR N=20

ERROR IN GROUP DELAY FOR N=20

METHOD FOR DESIGNING ALL PASS DIGITAL FILTERS

BACKGROUND OF THE INVENTION

1. Field of the Invention

The present invention relates to filter design, and more particularly to a method for determining coefficients for an all pass filter.

2. Description of the Related Art

All pass filters are used to realize a given group delay response in linear systems. Various methods have been proposed for designing all pass filters to satisfy a given group delay specification. For example, in "Design of Recursive Group Delay Filters by Autoregressive Modeling," IEEE Trans. Acoust., Speech and Signal Processing, Vol. ASP-30, pp. 632–637, August 1982, by B. Yegnanarayana, autoregressive modeling is used to derive the all pass filter coefficients from the cepstral coefficients. G. R. Reddy and M. N. S. Swamy, in "Digital All-pass Filter Design Through Discrete Hilbert Transform," pp. 646–649, ISCAS 1990, used the discrete Hilbert transform relationship between the log magnitude function and the phase of the Fourier transform to obtain the filter coefficients of an all pass filter. P. A. Bernhardt, in "Simplified Design of Higher-order Recursive Group Delay Filters," IEEE Trans. Acoust. Speech and Signal Processing, vol. ASSP-28, pp. 498–503, October 1980, used an iterative computer algorithm for solving a set of non-linear equations to get the parameters of the filter.

Although the above method provide alternatives to determining coefficients for all pass filter designs, the methods and algorithms are expensive in terms of time for processing. Therefore, a need exists for a method, which reduces the computation time and the complexity for determining all pass-filter coefficients.

SUMMARY OF THE INVENTION

A method for designing an all pass filter, in accordance with the present invention, includes providing a plurality of electrical or optical signals having a group delay, and normalizing the group delay to determine a normalized group delay function. Cepstral coefficients of the normalized group delay function are determined for to a denominator polynomial of a transfer function of the all pass filter wherein a magnitude function and the normalized group delay function of the denominator polynomial are related through the cepstral coefficients. The denominator polynomial coefficients are determined through a non-linear recursive difference equation by employing the cepstral coefficients.

In other methods, the step of determining cepstral coefficients may include the steps of determining the cepstral coefficients c(k) using the relation:

$$\tau(w) = \sum_{k=1}^{\infty} kc(k) \cos kw$$

where τ(w) is a group delay function k is an index and w is 2πf and f is a normalized sampling frequency. The relation may be solved by an Inverse Fast Fourier Transform (IFFT). The step of determining the denominator polynomial coefficients through a non-linear recursive difference equation by employing the cepstral coefficients may further include employing the non-linear recursive difference equation:

$$a_n = \sum_{k=0}^{n} \left(\frac{k}{n}\right) c(k) a_{n-k}, n > 0$$

to determine the denominator polynomial coefficients, wherein $a_n$ represents the denominator polynomial coefficients, c(k) represents the cepstral coefficients, k is an index, and n is the order of the all pass filter. The transfer function may given by H(z)=N(z)/D(z) where N(z) is a numerator polynomial and D(z) is the denominator polynomial. The coefficients of the denominator polynomial are preferably the same as the numerator polynomial with mirror-image symmetry such that determining the denominator polynomial coefficients determines H(z). The method steps of the present invention may be implemented on a program storage device readable by machine, tangibly embodying a program of instructions executable by the machine to perform method steps for is designing an all pass filter given a plurality of electrical or optical signals having a group delay.

A method for designing an all pass filter includes the steps of providing a plurality of electrical or optical signals having a group delay, normalizing the group delay to determine a normalized group delay function, and determining coefficients for the all pass filter. The step of determining coefficients for the all pass filter includes determining cepstral coefficients of the normalized group delay function by employing only one inverse Fourier transform operation and determining polynomial coefficients of the all pass filter through a non-linear recursive difference equation by employing the cepstral coefficients.

In other methods, the step of determining cepstral coefficients may include the steps of determining the cepstral coefficients c(k) using the relation:

$$\tau(w) = \sum_{k=1}^{\infty} kc(k) \cos kw$$

where τ(w) is a group delay function k is an index and w is 2πf and f is a normalized sampling frequency. The non-linear recursive difference equation may include:

$$a_n = \sum_{k=0}^{n} \left(\frac{k}{n}\right) c(k) a_{n-k}, n > 0,$$

wherein $a_n$ represents the polynomial coefficients, c(k) represents the cepstral coefficients, k is an index, and n is the order of the all pass filter. The transfer function may be given by H(z)=N(z)/D(z) where N(z) is a numerator polynomial and D(z) is a denominator polynomial, wherein the polynomial coefficients of the denominator polynomial are the same as the numerator polynomial with mirror-image symmetry such that determining the denominator polynomial coefficients determines H(z). The method steps of the present invention may be implemented on a program storage device readable by machine, tangibly embodying a program of instructions executable by the machine to perform method steps for designing an all pass filter given a plurality of signals having a group delay.

These and other objects, features and advantages of the present invention will become apparent from the following detailed description of illustrative embodiments thereof, which is to be read in connection with the accompanying drawings.

BRIEF DESCRIPTION OF DRAWINGS

The invention will be described in detail in the following description of preferred embodiments with reference to the following figures wherein.

DETAILED DESCRIPTION OF PREFERRED EMBODIMENTS

Figure 1:
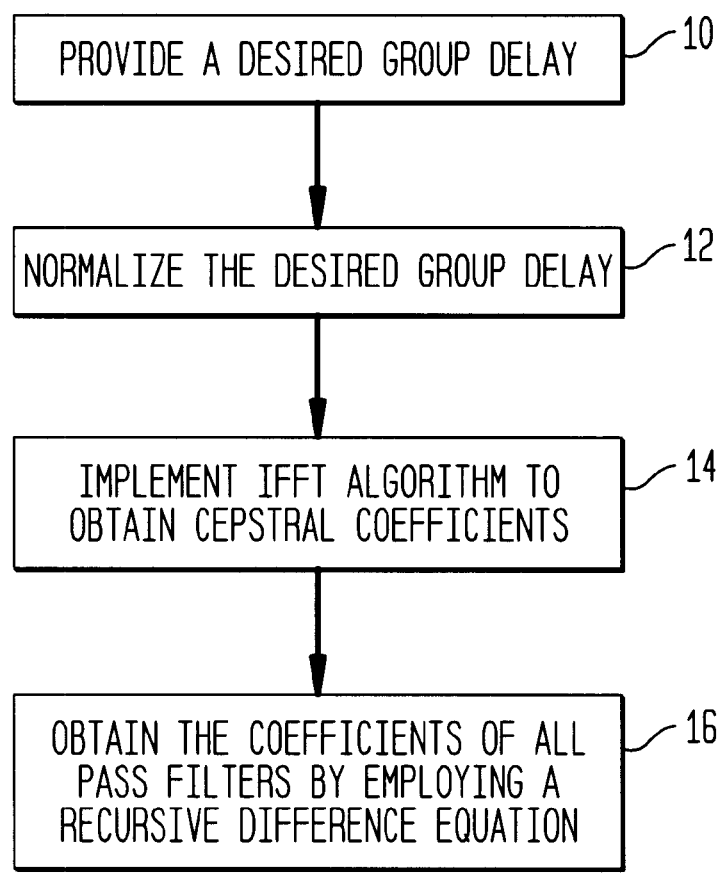
FIG. 1 is a block/flow diagram for designing an all pass filter in accordance with the present invention.

The present invention provides an improved method for designing an all pass filter to realize a given group delay characteristic. The use of cepstrum and a non-linear difference equation relating the cepstral coefficients and the coefficients of minimum phase sequence are demonstrated. The method solves the coefficients for an all pass filter with just one fast Fourier transform (FFT) operation and a recursive difference equation to arrive at the final coefficients.

All pass filters are employed for a plurality of different applications. All pass filters are used, for example, to compensate for time varying phase adjustments in a signal, for designing filter banks, and for designing digital filters that are less sensitive to coefficient quantization. All pass filters may be employed to compensate for frequency dependent delay distortion introduced by a channel in a digital communication system, such as, for example, a telephone system or network. All pass filters may be employed as a group delay equalizer for digital multiple tone systems (e.g., digital subscriber line (DSL) systems) to minimize delay spread of a channel.

The present invention provides methods for designing and fabricating an all pass filter used for filtering electrical or optical signals. The present invention may be employed for any applications described herein or known in the art. One method of the present invention employs a non-linear recursive difference equation that relates cepstral coefficients and time domain coefficients of a minimum phase sequence. A minimum phase sequence may be defined as a rational digital transfer function where all the roots of the numerator and denominator polynomials lie inside a unit circle in the Z-plane. The method proposed by Reddy et al. as cited above represents a common method for determining all pass filter coefficients. Reddy et al. require four Fast Fourier Transforms (FFTs) to arrive at the filter coefficients. As will be described herein the present invention advantageously reduces this to only one FFT.

A transfer function of an all pass filter of order N may be given by, $$H(z) = \frac{N(z)}{D(z)} = \frac{\sum_{n=0}^{N} a_{N-n} z^{-n}}{\sum_{n=0}^{N} a_n z^{-n}} \quad (1)$$

with $a_o=1$. From equation (1)

$$H(e^{jw}) = e^{-jwN} \frac{\sum_{n=0}^{N} a_n e^{jwn}}{\sum_{n=0}^{N} a_n e^{-jwn}} \quad (2)$$

where $z=e^{jw}$, $w=2\pi f$ and f is a frequency normalized to a sampling frequency.

The phase response $\theta(w)$ of the overall filter H(z) is given by:

$$\theta(w)=\theta_1(w)-\theta_2(w)=-Nw-2\theta_2(w) \quad (3)$$

where $\theta_1$ (w) and $\theta_2$ (w) denote the phase response of the numerator polynomial N(z) and the phase response of the denominator polynomial D(z), respectively.

The normalized group delay of the overall filter is given by:

$$\tau(w) = \frac{-d\theta(w)}{dw} = N + 2\theta'_2(w) \quad (4)$$

where $$\theta'_2(w) = \frac{d\theta_2(w)}{dw} = -\tau_2(w) \quad (5)$$

is the negative group delay of the denominator polynomial. Hence, the group delay response of the denominator polynomial can be obtained from the group delay response of the all pass filter using the relation:

$$\tau_2(w) = \frac{-\tau(w)}{2} + \frac{N}{2}. \quad (6)$$

The coefficients $a_n$ of the denominator polynomial D(z) and hence the filter H(z) are advantageously completely determined from $\tau_2(w)$.

Given a desired group delay function, parameters of the digital filter H(z) in Eq. (1) are to be obtained such that the resulting group delay response is $$\tau(w)=\tau_d(w). \quad (7)$$

From the given group delay function determine the desired group delay response $\tau_{2d}(w)$ of the denominator polynomial of the filter. That is $$\tau_{2d}(w) = \frac{-\tau_d(w)}{2} + \frac{N}{2}. \quad (8)$$

The value of N which is not known at the design stage is not necessary for determining the parameters of the filter. This is because any constant delay associated with N and the average group delay can be easily incorporated by using appropriate number of delay units.

Let $\overline{\tau_d}(w)$ and $\overline{\tau_{2d}}(w)$ be the average values of $\tau_d(w)$ and $\tau_{2d}(w)$ respectively, then we have $$\overline{\tau_{2d}}(w) = \frac{-\overline{\tau_d}(w)}{2} + \frac{N}{2} \quad (9)$$

and $$\tau_{2d}(w) - \overline{\tau_{2d}}(w) = \frac{-\tau_d(w) + \overline{\tau_d}(w)}{2}. \quad (10)$$

It is convenient to deal with $-(\tau_{2d}(w) - \overline{\tau_{2d}}(w))$ for deriving the coefficients of the denominator polynomial. Hence, we define $$\tau(w) = -(\tau_{2d}(w) - \overline{\tau_{2d}}(w)) = \frac{\tau_d(w) - \overline{\tau_d}(w)}{2}. \quad (11)$$

Relations among group delay, cepstral coefficients and magnitude spectrum will now be described. Let $V(w)$ be the frequency response of a minimum phase all pole digital filter. An all pole digital filter is a rational digital transfer function where the numerator polynomial is of degree zero and the denominator is a polynomial of degree greater than or equal to one. Since the cepstrum of a minimum phase sequence is a causal sequence (a causal sequence is a digital sequence whose values are zero for the future or later samples), $\ln(V(w))$ can be expressed as $$\ln V(w) = c(0)/2 + \sum_{k=1}^{\infty} c(k)e^{jkw} \quad (12)$$

where $c(k)$ are called the cepstral coefficients and ln is the natural logarithm function. Writing $$V(w) = |V(w)|e^{-j\theta_v(w)}, \quad (13)$$

then the real part of the $\ln(V(w))$ is given by $$\ln|V(w)| = c(0)/2 + \sum_{k=1}^{\infty} c(k)\cos kw, \quad (14)$$

and the imaginary part is given by $$\theta_v(w) + 2\lambda\pi = \sum_{k=1}^{\infty} c(k)\sin kw \quad (15)$$

where $\lambda$ is an integer. Equation (14) is the log magnitude function or spectrum of the signals. Taking the derivative of (15), we get the group delay of the minimum phase all pole digital filter that is given by $$\theta_v^1(w) = \sum_{k=1}^{\infty} kc(k)\cos kw \quad (16)$$

where $\theta_v'(w)$ represents the group delay of the minimum phase all-pole filter.

Given the group delay specification the cepstral coefficients corresponding to the pole part of the filter is determined by using the relation (16). From the cepstral coefficients, the coefficients of the denominator polynomial are computed using a recursive non-linear difference equation given by:

$$a_n = \sum_{k=0}^{n} \left(\frac{k}{n}\right) c(k) a_{n-k}, n > 0 \quad (17)$$

where $c(0) = 0$ and $a_0 = a\log[c(0)] = 1$. Once $a_k$'s for $k = 1, 2, 3, \ldots, N$ ($n = N$) are known, all the parameters of the filter $H(z)$ are known. In general, approximation to the desired group delay will be better for larger values of N.

It is to be understood that the elements shown in FIG. 1 may be implemented in various forms of hardware, software or combinations thereof. Preferably, these elements are implemented in software on one or more appropriately programmed general purpose digital processors or computers having a memory and input/output interfaces. Referring now to the drawings in which like numerals represent the same or similar elements and initially to FIG. 1, a block/flow diagram is shown for determining coefficients for an all pass filter in accordance with the present invention.

In block 10, a desired group delay is given. The group delay is determined for one or more signals which are to be input to the all pass filter of the present invention. All pass filters are employed as a delay equalizer for adjusting the phase shifts of one or more signals to account for phase shifts or delays between the signals. In block 12, the desired group delay is normalized, for example, in accordance with equations (4) and (5). The normalized group delay is determined by a group delay function. In an illustrative embodiment, let $\tau_d(k) = \tau_d(w)|_{w=2\pi k/M}$ be the desired group delay function. M is the size of the FFT used in the computation and k varies from 0 to M-1. From equation (11), compute $$\tau(k) = \frac{\tau_d(k) - \overline{\tau_d}(k)}{2}$$

where $$\overline{\tau_d}(k) = \frac{1}{M} \sum_{k=0}^{M-1} \tau_d(k).$$

This yields the normalized group delay of the overall filter.

In block 14, cepstral coefficients are determined in accordance with the invention. The cepstral coefficients $c(k)$ may be determined using the relation $$\tau(w) = \sum_{k=1}^{\infty} kc(k)\cos kw.$$

The above relation may preferably be implemented by using an Inverse Fast Fourier Transform (IFFT) algorithm of size M. Other transforms may also be employed.

In block 16, denominator polynomial coefficients are calculated preferably by using the relation in equation (17):

$$a_n = \sum_{k=0}^{n} \left(\frac{k}{n}\right) c(k) a_{n-k},$$

The order of the filter N and the coefficients $a_n$ can be selected depending upon the accuracy desired in the group delay. The coefficients $a_n$ are determined in an efficient manner by the present invention. Advantageously, only one IFFT and one recursive non-linear difference equation are needed to determine these coefficients. These coefficients are employed in, for example, equation (2) to determine the transfer function of the all pass filter.

In prior art systems such as those described above, at least three FFT operations are needed. For example, in the method of Reddy et al. cepstral coefficients are determined by IFFT. Then, a spectrum is computed using a FFT and an exponential function. Finally, the coefficients are found by employing yet another IFFT.

The present invention advantageously provide less computational overhead and is capable of providing real-time determination of $a_n$ coefficients, and therefore provides the real-time determination of the features/characteristics of the all pass filter for use with, for example, digital signal processors (DSPs). Real-time as referred to above means not offline.

SIMULATION RESULTS

Figure 2:
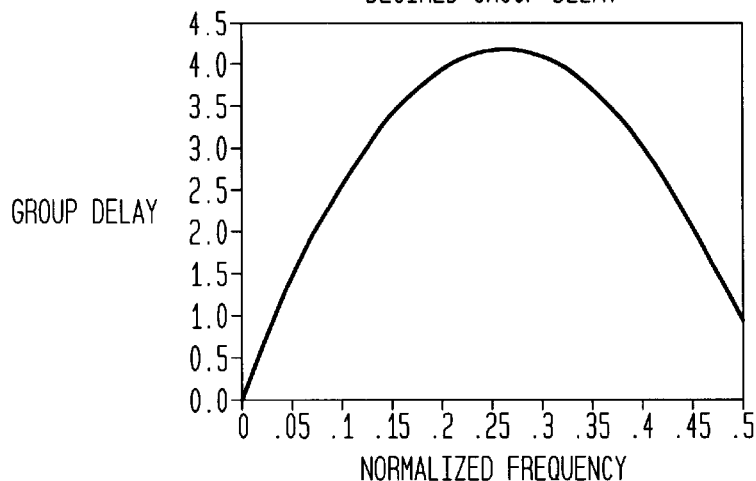
FIG. 2 is a plot of group delay versus normalized frequency for a desired group delay characteristic for use in accordance with the present invention.

Simulation results are presented for realizing a quadratic group delay characteristic. The amplitude of the error has an almost equi-ripple characteristic and decreases as the filter order increases. An all pass filter with a quadratic group delay characteristic is considered in Reddy et al. The same quadratic group delay characteristic was employed in accordance with the present invention. A 512 point IFFT has been used in the example. The desired group delay characteristic shown in FIG. 2 is given by $\tau_d(w)=(10w-3w^2), 0 \leq w \leq \pi$. In discrete frequency points it can be specified as $$\tau_d(i) = \frac{2\pi(i-1)}{512}\left(10 - 3x\frac{2\pi(i-1)}{512}\right), \text{ for } i = 1, 2, \ldots, 257$$
$$= \tau_d(514 - i), \qquad \text{for } i = 258, 259, \ldots, 512$$

The denominator polynomial obtained for N=10 is given by $$D(z) = 1 - 0.3662z^{-1} - 0.683z^{-2} + 0.2529z^{-3} +$$
$$0.1429z^{-4} - 0.0562z^{-5} - 0.0182z^{-6} +$$
$$0.0077z^{-7} - 0.001z^{-8} + 0.0001z^{-9} -$$
$$0.0011z^{-10}.$$

Figure 3:
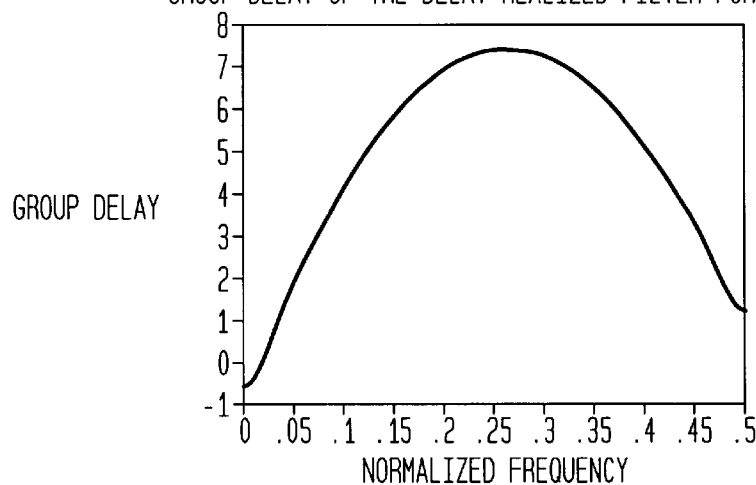
FIG. 3 is a plot of group delay versus normalized frequency for an all pass filter having N=10 in accordance with the present invention.
Figure 4:
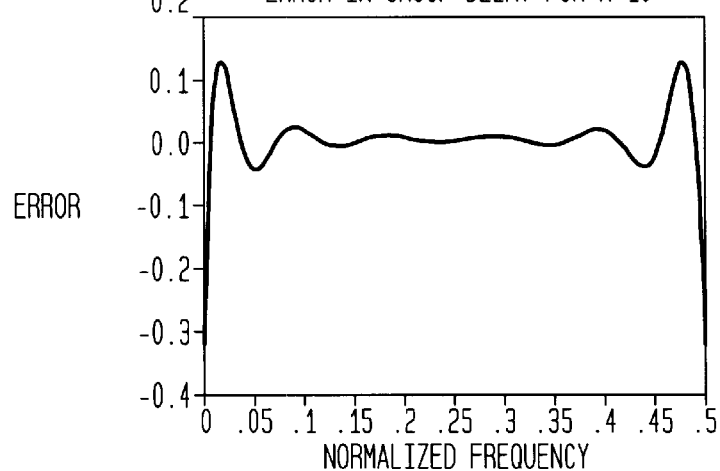
FIG. 4 is a plot of error in group delay versus normalized frequency for an all pass filter having N=10 in accordance with the present invention.
Figure 5:
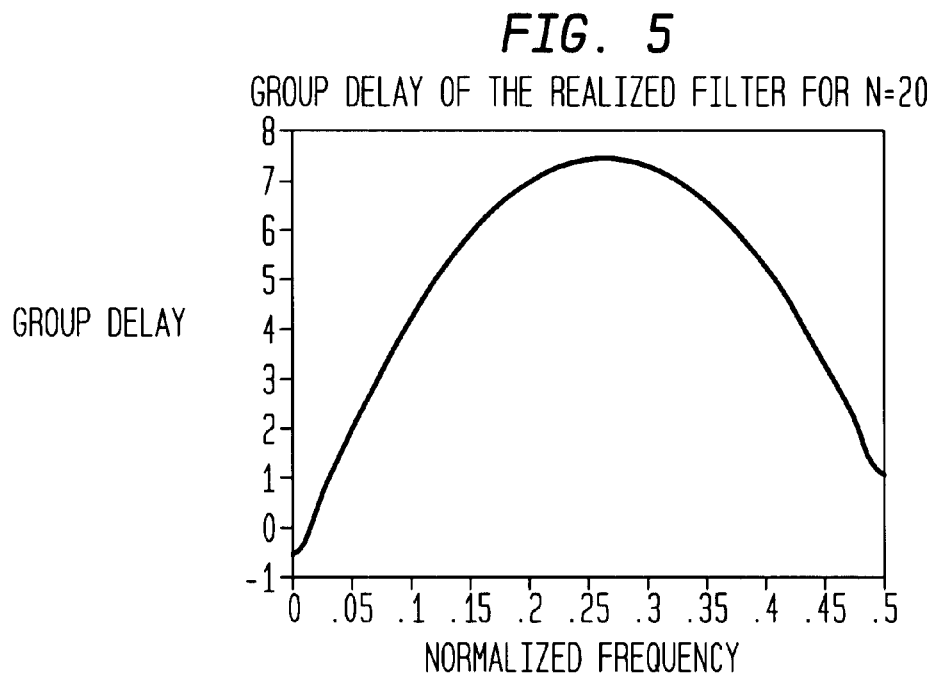
FIG. 5 is a plot of group delay versus normalized frequency for an all pass filter having N=20 in accordance with the present invention.
Figure 6:
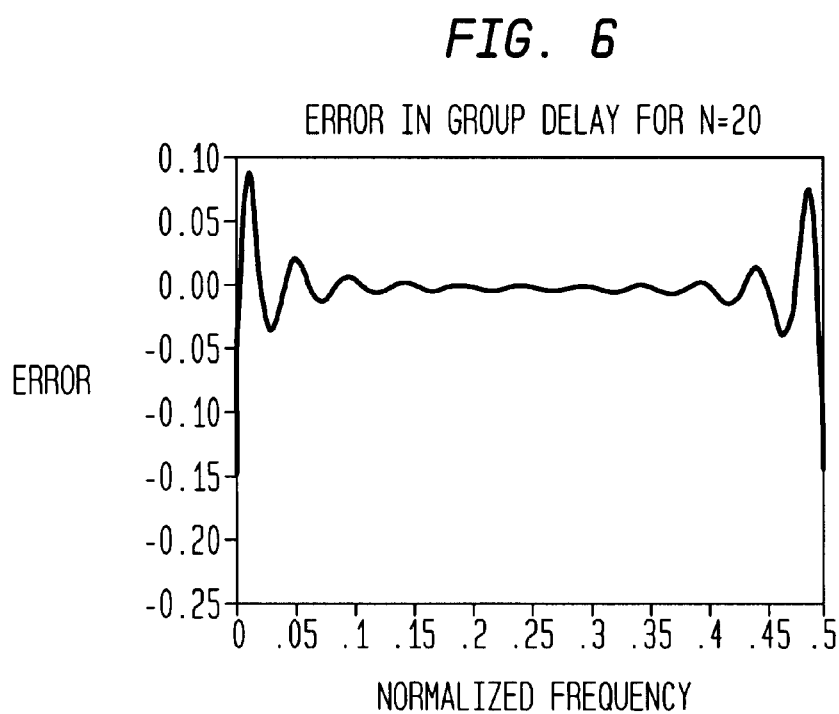
FIG. 6 is a plot of error in group delay versus normalized frequency for an all pass filter having N=20 in accordance with the present invention.

The group delay response realized for N=10 and N=20 are shown in FIG. 3 and FIG. 5. FIG. 4 and FIG. 6 show the corresponding error curves for N=10 and N=20, respectively. The results agree with the results obtained in Reddy et al. with less computational overhead. For example, on a same computer processor coefficients are determined for an all pass filter in accordance with the present invention in about 60% less time. This is illustrative only, and depends on the application and hardware/software employed. Greater reductions in time are also contemplated for the present invention.

The methods of the present invention for designing a recursive all pass digital filter have been described. These methods employ cepstral coefficients to design the all pass filter. For a stable all pass filter the denominator polynomial is preferably of minimum phase. For a minimum phase polynomial the magnitude function and the group delay function are related through the cepstral coefficients. Hence, given the group delay function the cepstral coefficients corresponding to the denominator polynomial part are first determined. From the cepstral coefficients, the minimum phase denominator polynomial coefficients are determined through a non-linear recursive difference equation.

Having described preferred embodiments of a system and method for designing all pass digital filters (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by Letters Patent is set forth in the appended claims.

What is claimed is:

1. A method for designing an all pass filter comprising the steps of:

providing a plurality of signals having a group delay;

normalizing the group delay to determine a normalized group delay function;

determining cepstral coefficients of the normalized group delay function for a denominator polynomial of a transfer function of the all pass filter wherein a magnitude function and the normalized group delay function of the denominator polynomial are related through the cepstral coefficients; and determining the denominator polynomial coefficients through a non-linear recursive difference equation by employing the cepstral coefficients.

2. The method as recited in claim 1, wherein the step of determining cepstral coefficients includes the steps of determining the cepstral coefficients c(k) using the relation:

$$\tau(w) = \sum_{k=1}^{\infty} kc(k)\cos kw$$

where $\tau(w)$ is a group delay function k is an index and w is $2\pi f$ and f is a normalized sampling frequency.

3. The method as recited in claim 2, wherein the relation $$\tau(w) = \sum_{k=1}^{\infty} kc(k)\cos kw$$

is solved by an Inverse Fast Fourier Transform (IFFT).

4. The method as recited in claim 1, wherein the step of determining the-denominator polynomial coefficients through a non-linear recursive difference equation by employing the cepstral coefficients further includes employing the non-linear recursive difference equation:

$$a_n = \sum_{k=0}^{n} \left(\frac{k}{n}\right) c(k) a_{n-k}, n > 0$$

to determine the denominator polynomial coefficients, wherein $a_n$ represents the denominator polynomial coefficients, c(k) represents the cepstral coefficients, k is an index, and n is the order of the all pass filter.

5. The method as recited in claim 1, wherein the transfer function is given by H(z)=N(z)/D(z) where N(z) is a numerator polynomial and D(z) is the denominator polynomial.

6. The method as recited in claim 5, wherein the coefficients of the denominator polynomial are the same as the numerator polynomial with mirror-image symmetry such that determining the denominator polynomial coefficients determines H(z).

7. A program storage device readable by machine, tangibly embodying a program of instructions executable by the machine to perform method steps for designing an all pass filter given a plurality of signals having a group delay, the method steps comprising:

normalizing the group delay to determine a normalized group delay function;

determining cepstral coefficients of the normalized group delay function for to a denominator polynomial of a transfer function of the all pass filter wherein a magnitude function and the group delay function of the denominator polynomial are related through the cepstral coefficients; and determining the denominator polynomial coefficients through a non-linear recursive difference equation by employing the cepstral coefficients.

8. The program storage device as recited in claim 7, wherein the step of determining cepstral coefficients includes the steps of determining the cepstral coefficients c(k) using the relation:

$$\tau(w) = \sum_{k=1}^{\infty} kc(k)\cos kw$$

where $\tau(w)$ is a group delay function k is an index and w is $2\pi f$ and f is a normalized sampling frequency.

9. The program storage device as recited in claim 8, wherein the relation $$\tau(w) = \sum_{k=1}^{\infty} kc(k)\cos kw$$

is solved by an Inverse Fast Fourier Transform (IFFT).

10. The program storage device as recited in claim 7, wherein the step of determining the denominator polynomial coefficients through a non-linear recursive difference equation by employing the cepstral coefficients further includes employing the non-linear recursive difference equation:

$$a_n = \sum_{k=0}^{n} \left(\frac{k}{n}\right) c(k) a_{n-k}, n > 0$$

to determine the denominator polynomial coefficients, wherein $a_n$ represents the denominator polynomial coefficients, c(k) represents the cepstral coefficients, k is an index, and n is the order of the all pass filter.

11. The program storage device as recited in claim 7, wherein the transfer function is given by H(z)=N(z)/D(z) where N(z) is a numerator polynomial and D(z) is the denominator polynomial.

12. The method as recited in claim 11, wherein the coefficients of the denominator polynomial are the same as the numerator polynomial with mirror-image symmetry such that determining the denominator polynomial coefficients determines H(z).

13. A method for designing an all pass filter comprising the steps of:

providing a plurality of signals having a group delay;

normalizing the group delay to determine a normalized group delay function;

determining coefficients for the all pass filter by:

determining cepstral coefficients of the normalized group delay function by employing only one inverse Fourier transform operation; and determining polynomial coefficients of the all pass filter through a non-linear recursive difference equation by employing the cepstral coefficients.

14. The method as recited in claim 1, wherein the step of determining cepstral coefficients includes the steps of determining the cepstral coefficients c(k) using the relation:

$$\tau(w) = \sum_{k=1}^{\infty} kc(k)\cos kw$$

where $\tau(w)$ is a group delay function k is an index and w is $2\pi f$ and f is a normalized sampling frequency.

15. The method as recited in claim 13, wherein the non-linear recursive difference equation includes:

$$a_n = \sum_{k=0}^{n} \left(\frac{k}{n}\right) c(k) a_{n-k}, n > 0,$$

wherein $a_n$ represents the polynomial coefficients, c(k) represents the cepstral coefficients, k is an index, and n is the order of the all pass filter.

16. The method as recited in claim 13, wherein the transfer function is given by H(z)=N(z)/D(z) where N(z) is a numerator polynomial and D(z) is a denominator polynomial, wherein the polynomial coefficients of the denominator polynomial are the same as the numerator polynomial with mirror-image symmetry such that determining the denominator polynomial coefficients determines H(z).

17. A program storage device readable by machine, tangibly embodying a program of instructions executable by the machine to perform method steps for designing an all pass filter given a plurality of signals having a group delay, the method steps comprising:

normalizing the group delay to determine a normalized group delay function;

determining coefficients for the all pass filter by:

determining cepstral coefficients of the group delay function by employing only one inverse Fourier transform operation; and determining polynomial coefficients of the all pass filter through a non-linear recursive difference equation by employing the cepstral coefficients.

18. The program storage device as recited in claim 17, wherein the step of determining cepstral coefficients includes the steps of determining the cepstral coefficients c(k) using the relation:

$$\tau(w) = \sum_{k=1}^{\infty} kc(k)\cos kw$$

where τ(w) is a group delay function k is an index and w is 2πf and f is a normalized sampling frequency.

19. The program storage device as recited in claim 17, wherein the non-linear recursive difference equation includes:

$$a_n = \sum_{k=0}^{n} \left(\frac{k}{n}\right) c(k) a_{n-k}, n > 0,$$

wherein $a_n$ represents the polynomial coefficients, c(k) represents the cepstral coefficients, k is an index, and n is the order of the all pass filter.

20. The program storage device as recited in claim 17, wherein the transfer function is given by H(z)=N(z)/D(z) where N(z) is a numerator polynomial and D(z) is a denominator polynomial, wherein the polynomial coefficients of the denominator polynomial are the same as the numerator polynomial with mirror-image symmetry such that determining the denominator polynomial coefficients determines H(z).

* * * * *